United States Patent [19]

Yamamura

[11] Patent Number: 4,572,965
[45] Date of Patent: Feb. 25, 1986

[54] CIRCUIT FOR DETECTING EXISTENCE OF AN INFORMATION SIGNAL

[75] Inventor: Shinichi Yamamura, Tokyo, Japan

[73] Assignee: Sony Corporation, Tokyo, Japan

[21] Appl. No.: 724,053

[22] Filed: Apr. 18, 1985

Related U.S. Application Data

[63] Continuation of Ser. No. 416,334, Sep. 9, 1982, abandoned.

[30] Foreign Application Priority Data

Sep. 14, 1981 [JP] Japan .................... 56-145334

[51] Int. Cl.³ .................... H03K 17/16; H04B 15/00
[52] U.S. Cl. .................... 307/130; 455/222; 369/59; 369/124; 307/350; 307/542
[58] Field of Search ............ 307/130, 350, 354, 358, 307/542; 455/212, 218, 221, 222, 225; 369/124, 59

[56] References Cited

U.S. PATENT DOCUMENTS 3,760,255  9/1973  Grodinsky .................... 307/350 X
3,983,417  9/1976  Rheinfelder .................... 307/350 X
4,124,819  11/1978  Hansen .................... 307/542

Primary Examiner—A. D. Pellinen
Assistant Examiner—T. DeBoer
Attorney, Agent, or Firm—Hill, Van Santen, Steadman & Simpson

[57] ABSTRACT

A circuit for detecting existence of an information signal comprising an input circuit provided for supply with the information signal, a clamp circuit for clamping a signal obtained from the input circuit to a predetermined fixed DC level, a level detector for detecting the amplitude level of an output of the clamp circuit and for producing a DC output with its level corresponding to the detected amplitude level, and a level comparator for comparing the DC output from the level detector with a predetermined reference voltage to produce an output signal assuming a first level when the DC output is higher than the reference voltage and a second level when the DC output is lower than the reference voltage. The first level or second level of the output signal from the level comparator indicates that the information signal is supplied to the input circuit.

2 Claims, 15 Drawing Figures

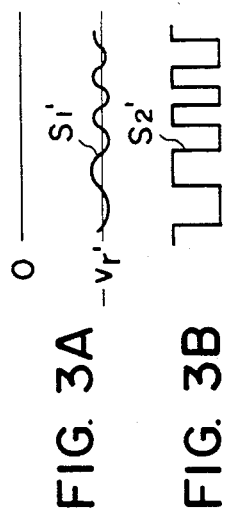
FIG. 3A
FIG. 3B
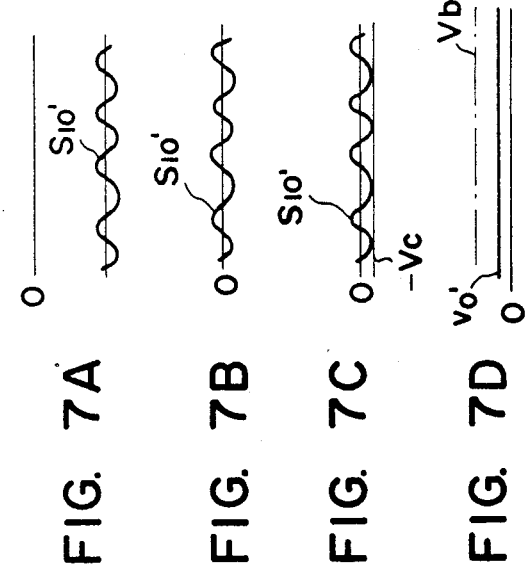
FIG. 7A
FIG. 7B
FIG. 7C
FIG. 7D
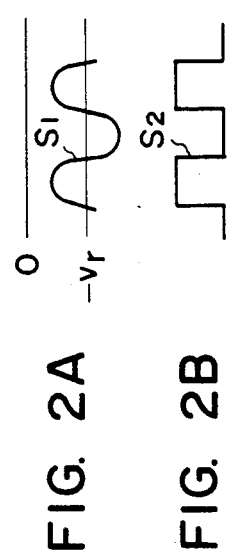
FIG. 2A
FIG. 2B
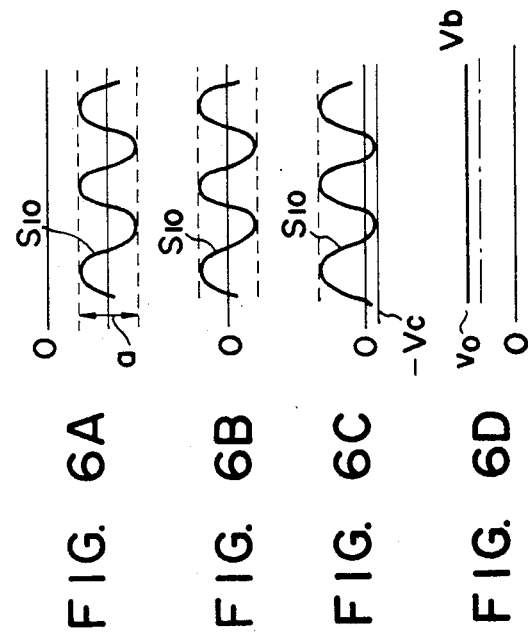
FIG. 6A
FIG. 6B
FIG. 6C
FIG. 6D

CIRCUIT FOR DETECTING EXISTENCE OF AN INFORMATION SIGNAL

This is a continuation of application Ser. No. 416,334 filed Sept. 9, 1982, now abandoned.

BACKGROUND OF THE INVENTION

This invention relates generally to circuits for detecting existence of a given electric signal, and more particularly, is directed to improvements in a circuit for detecting existence of an information signal which is suitable for use in an apparatus for reproducing an information signal in the information signal recording and/or reproducing system such as the digital audio disc system.

In a digital audio disc system a digital audio disc which is a rotatable disc shaped recorded medium on which a digital audio signal is recorded as an information signal is provided. Such a digital audio disc is applied to a reproducing apparatus so that the digital audio signal recorded on the digital audio disc is reproduced. In such a known system, a reproduced audio signal of high quality can be obtained easily, and various different types of such a system have been already proposed. One of them is the optical digital audio disc system wherein a laser light beam, for example, is utilized to record and/or read out the digital audio signal.

In production of the digital audio disc, that is, recording of the digital audio signal, in the optical digital audio disc system, first an audio signal to be recorded is converted into a digital signal, for example, a pulse code modulation (PCM) signal modulated in a predetermined pulse code, and a laser beam modulated in intensity by this PCM signal is impinged on a recording medium provided appropriately to form a large number of pits or bumps on the recording medium in response to the variations in "1" and "0" of the PCM signal, so that a record master is produced. Then a plurality of duplicated digital audio discs are pressed by the record master.

In a manufacturing process of such a record master, the pits formed on the record master are provided in a different manner with the same PCM signal as a result of the difference in the power of the laser beam or other conditions in relation to the laser beam, and therefore it would also result that the digital audio discs duplicated from different record masters have different pit formations depending on the respective record masters. For example, digital audio discs having the different respective ratios in length of a pit to a portion next to the pit at the place where the PCM signal recorded thereat has the same pulse width for both "1" and "0" would be produced. When one of such digital audio discs is applied to a reproducing apparatus which has an optical head for reading out the recorded PCM signal from the disc by means of scanning the pits by the laser beam therefrom, it will result that the signal read out from the disc has its portions corresponding to for "1" and "0" with different time lengths, respectively, at the place on the disc where the PCM signal recorded thereat has the same pulse width for both "1" and "0". This phenomenon is called "asymmetry". In case the asymmetry arises, it is easily caused that a reproduced PCM signal obtained by wave-shaping the signal read out from the disc into a pulse train becomes different from the recorded PCM signal. This would result in the audio signal not being reproduced properly.

Accordingly, to avoid the problem mentioned above, in the reproducing apparatus in the optical digital audio disc system, a wave shaping circuit for reforming the signal read out from the digital audio disc, that is, a reproduced information signal into a pulse train, is provided with a countermeasure to the asymmetry so that the reproduced PCM signal can be properly obtained under the situation of the asymmetry. In such a reproducing apparatus, the wave shaping circuit which is operative to correct the errors induced in the reproduced information signal by the asymmetry and reform the reproduced information signal into the properly reproduced PCM signal is provided. However, when the reproduced information signal is not obtained when the disc is not rotated or the disc is not applied to the reproducing apparatus, the wave shaping circuit generates a spurious pulse signal as if it were generating to reproduced PCM signal, and the spurious pulse signal causes trouble in the reproducing apparatus such that it makes a buzz noise sound and click noise or to make a control mechanism therein operate improperly.

To avoid such a problem, it is effective to distinguish between a situation wherein the reproduced information signal is obtained and a situation wherein the reproduced information signal is not obtained, and make the reproducing apparatus inoperative and further suitably protect suitably the control mechanism in the reproducing apparatus when the reproduced information signal is not obtained.

For the purpose of making the above distinction, a circuit for detecting existence of the reproduced information signal has been provided in the reproducing apparatus. The previously proposed detecting circuit employed in the reproducing apparatus utilizes the fact that the reproduced information signal obtained from the disc has the frequency characteristic which has a peak at a particular frequency when the disc rotates at a proper rotating speed for detecting existence of the reproduced information signal. In such a detecting circuit, a frequency component having the particular frequency is extracted from the signal obtained at the output of the optical head and the level of the frequency component is measured, and as a result, it is concluded that the reproduced information signal is obtained when the level of the frequency component exceeds a predetermined reference level.

However, with the previously proposed detecting circuit mentioned above, it is very difficult to determine appropriately the predetermined reference level of the frequency component having the particular frequency, and in addition the distinction can be made only when the disc rotates at the proper rotating speed. Further, the previously proposed detecting circuit requires many parts and the circuit structure is very complicated.

SUMMARY OF THE INVENTION

It is an object of the present invention to provide an improved circuit for detecting existence of an information signal which avoids the above mentioned defect and disadvantage inherent in the previously proposed detecting circuit.

Another object of the present invention is to provide an improved circuit for detecting existence of an information signal suitable for use in a reproducing apparatus in the optical digital audio disc system.

Other objects, features and advantages of the present invention will be apparent from the following description taken in conjunction with the accompanying drawings.

BRIEF DESCRIPTION OF THE DRAWINGS

FIGS. 2A, 2B, 3A and 3B are waveform diagrams used for explaining the operation of the part of the reproducing apparatus shown in FIG. 1;

FIGS. 6A, 6B, 6C, 6D, 7A, 7B, 7C and 7D are waveform diagrams used for explaining the operation of the circuit according to the present invention shown in FIG. 5.

DESCRIPTION OF THE PREFERRED EMBODIMENT

First, to assist understanding of the embodiment, an example of a reproducing apparatus in the optical digital audio disc system, to which a circuit for detecting existence of an information signal according to the present invention can be applied, and a previously proposed circuit for detecting existence of an information signal, will be explained with reference to FIGS. 1 to 4.

Figure 1:
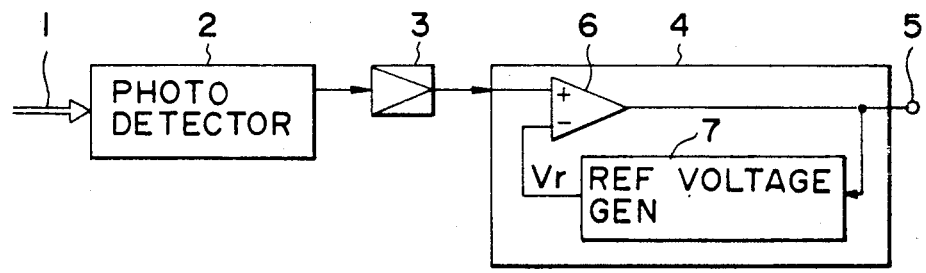
FIG. 1 is a schematic block diagram showing a part of an example of a reproducing apparatus in the optical digital audio disc system.

In the reproducing apparatus in the optical digital audio disc system, a part of which is shown in FIG. 1, a signal reading laser light 1 from a digital audio disc which is rotating is received by a photo-detector 2 and subjected to the photo-electrical conversion therein. In case the signal reading laser light 1 is coming from a recording track portion of the digital audio disc, where a PCM signal is recorded, a reproduced information signal $S_1$ having a waveform like a sine curve and a negative DC level, for example, as shown in FIG. 2A, is obtained by the photo-electrical conversion in the photo-detector 2. The reproduced information signal $S_1$ is amplified by an amplifier circuit 3 and supplied to a wave shaping circuit 4. At the wave shaping circuit 4, the reproduced information signal $S_1$ is reformed into a rectangular pulse train to produce a reproduced PCM signal $S_2$ as shown in FIG. 2B at an output terminal 5. The wave shaping circuit 4 consists of a comparator 6 and a reference voltage generator 7, and the reproduced information signal $S_1$ and a reference voltage Vr from the reference voltage generator 7 are supplied to positive and negative input terminals of the comparator 6. At the output of the comparator 6, an output signal of a predetermined voltage appears when the level of the reproduced information signal $S_1$ coincides with or exceeds the reference voltage Vr, so that the rectangular pulse train assuming "1" or "0" in response to the reproduced information signal $S_1$ is obtained. The reference voltage generator 7 produces such a reference voltage Vr that the portions representing "1" and "0", respectively, of the output of the comparator 6, which correspond to the portions representing "1" and "0", respectively, of the PCM signal recorded on the digital audio disc which are successive and have the same time length, such as portions representing a frame synchronous signal, respectively, are given the same time length. For example, in the case of the reproduced information signal $S_1$ as shown in FIG. 2A, the reference voltage Vr assumes a level $-v_r$ shown in FIG. 2A.

With such a wave shaping circuit 4, even if the asymmetry arises, the reproduced information signal $S_1$ is compared to be reformed with the reference voltage Vr having the level determined so as to correct the errors induced in the reproduced information signal $S_1$ by the asymmetry at the comparator 6, and therefore the proper reproduced PCM signal is obtained.

However, in the reproducing apparatus as mentioned above, when the reproduced information signal $S_1$ is not obtained such that the digital audio disc is not rotated or is not applied to the reproducing apparatus, a spurious signal $S_1'$ formed of a noise component having a predetermined DC level, as shown in FIG. 3A, appears at the output end of the amplifier circuit 3 and is supplied to the wave shaping circuit 4. In this case, the comparator 6 and the reference voltage generator 7 forming the wave shaping circuit 4 processes the spurious signal $S_1'$ in the same manner as the reproduced information signal $S_1$, and the reference voltage generator 7 produces the reference voltage Vr having a level $-v_r'$ shown in FIG. 3A. The comparator 6 produces an output signal of the predetermined voltage when the level of the spurious signal $S_1'$ coincides with or exceeds the reference voltage Vr having the level $-v_r'$ so as to form a spurious pulse signal $S_2'$ as shown in FIG. 3B. The spurious pulse signal $S_2'$ appearing at the output terminal 5 is supplied to a decoder (not shown) in the same manner as the reproduced PCM signal. Since the spurious pulse signal $S_2'$ represents the noise and is coded at random, the coding errors of the spurious pulse signal $S_2'$ are not corrected by the error correction in the decoder. Consequently, a buzz noise sound or a click noise sound is produced by the spurious pulse signal $S_2'$ and the control mechanism in the reproducing apparatus operates improperly as a result of the spurious pulse signal $S_2'$.

The above mentioned problem caused by the spurious pulse signal $S_2'$ results from the fact that the reference voltage generator 7 which is contained in the wave shaping circuit 4 as the countermeasure against the asymmetry generates the reference voltage Vr having the level determined in response to the level of the input signal to the wave shaping circuit 4, and supplies it to the comparator 6. This problem is caused only when the reproduced information signal $S_1$ is not obtained. Therefore, it is possible to avoid the trouble mentioned above if the situation wherein the reproduced information signal $S_1$ is not obtained is detected and the reproducing apparatus is made inoperative when the reproduced information signal $S_1$ is not obtained.

Figure 4:
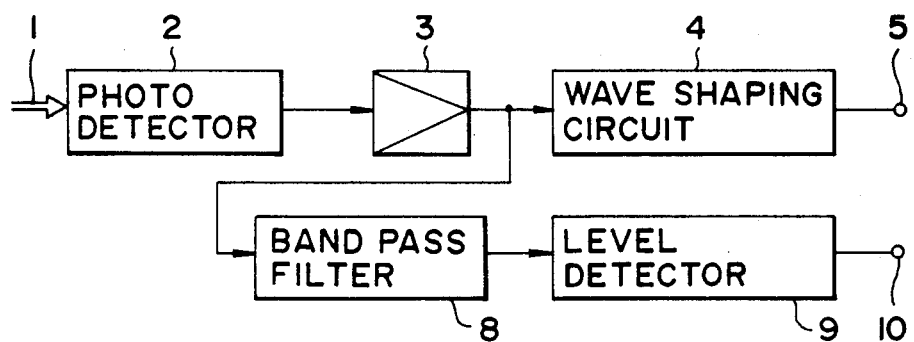
FIG. 4 is a schematic block diagram showing a previously proposed circuit for detecting existence of an information signal.

For the purpose of detecting the situation wherein the reproduced information signal $S_1$ is not obtained, such a detecting circuit as shown in FIG. 4 has been proposed previously. This detecting circuit comprises a band pass filter 8 which is connected to the output end of the amplified circuit 3 to extract a signal component having a particular frequency $f_0$ from the output signal of the amplifier circuit 3. A level detector 9 is connected to the output end of the band pass filter 8 and an output terminal 10 is attached to the level detector. This detecting circuit detects existence of the reproduced information signal by means of utilizing the fact that the reproduced information signal obtained from the disc has the frequency characteristic which has a peak at a particular frequency, for example, about 400 Hz when the disc rotates at a proper rotating speed. In the circuit, the signal component having the particular frequency $f_0$ is extracted by the band pass filter 8 and is supplied to the level detector 9 so that the level of the signal component having the particular frequency $f_0$ is measured. As a result of the measure at the level detector 9, in case the level of the signal component having the particular frequency $f_0$ is lower than a predetermined reference level, an output signal is obtained at the output terminal 10, for example. That is, it is concluded that the reproduced information signal is obtained when the level of the extracted signal component having the particular frequency $f_0$ coincides with or exceeds the predetermined reference level, and on the other hand, it is concluded that the reproduced information signal is not obtained when the level of the extracting signal component having the particular frequency $f_0$ is lower than the predetermined reference level and the detected output is produced at the output terminal 10.

However, this previously proposed detecting circuit has the defect and disadvantage aforementioned.

Now, one circuit embodiment of circuit for detecting existence of an information signal according to the present invention will be explained with reference to FIGS. 5, 6A–6D and 7A–7D.

Figure 5:
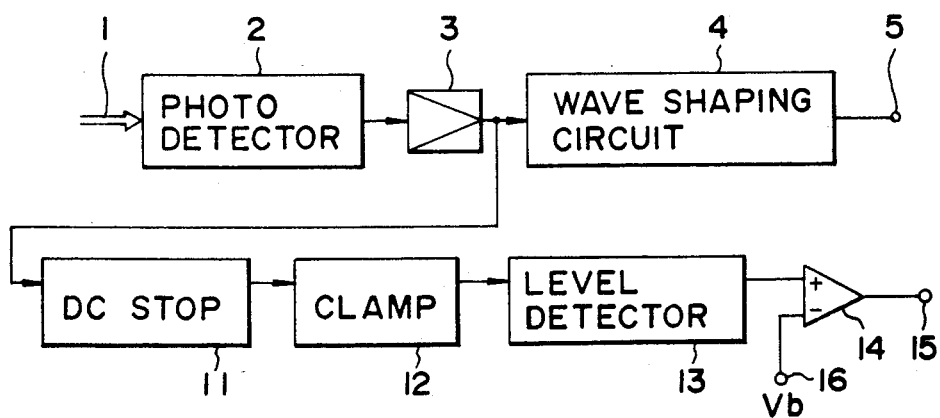
FIG. 5 is a schematic block diagram showing one embodiment of a circuit for detecting existence of an information signal according to the present invention employed in a reproducing apparatus in the optical digital audio disc system.

FIG. 5 shows the embodiment employed in the reproducing apparatus in the optical digital audio disc system for detecting existence of the reproduced information signal from the digital audio disc. In FIG. 5, the photo-detector 2 for receiving the signal reading laser light 1, the amplifier circuit 3, the wave shaping circuit 4 and the output terminal 5 constitute the part of the reproducing apparatus in the optical digital audio disc system, as explained with reference to FIG. 1. The amplifier circuit 3 forms an information signal input portion of the circuit according to the present invention. A DC stopping circuit 11 is connected to the output end of the amplified circuit 3, and at the output end of the DC stopping circuit 11, a clamp circuit 12, a level detector 13 and a level comparator 14 are connected in series. An output terminal 15 is provided at the output end of the level comparator 14. Incidentally, one of the input terminals of the level comparator 14 is connected to a terminal 16 to which a reference voltage is supplied.

Next, the operation of the embodiment constituted as above mentioned will be explained. When a reproduced information signal is obtained from the digital audio disc, an amplified reproduced information signal $S_{10}$ having a predetermined DC level and an amplitude a, as shown in FIG. 6A, is obtained at the output end of the amplifier circuit 3. This reproduced information signal $S_{10}$ is supplied to the DC stopping circuit 11. The DC level of the reproduced information signal $S_{10}$ is shifted to zero, as shown in FIG. 6B, at the DC stopping circuit. The signal $S_{10}$ with the DC level shifted to zero is supplied to the clamp circuit 12. The clamp circuit 12 is operative to clamp an input signal supplied thereto to a predetermined fixed DC level, for example a negative level $-Vc$, and at the output end of the clamp circuit 12, the signal $S_{10}$ with its bottom clamped to the level $-Vc$ as shown in FIG. 6C, is obtained to be supplied to the level detecting circuit 13. The level detector 13 is formed pratically as a low pass filter or an integrating circuit and a DC output $v_O$ of the average level or the peak level of the signal $S_{10}$ clamped to the level $-Vc$, as shown in FIG. 6D, is obtained at the output end of the level detector 13. This DC output $v_O$ is supplied to one of the input terminals, for example a positive input terminal, of the level comparator 14 and compared with the reference voltage supplied to the terminal 16 which is connected to the other of the input terminals, for example a negative input terminal, of the level comparator 14.

On the other hand, when the reproduced information signal is not obtained, a spurious signal $S_{10}'$ having a noise component and a predetermined negative DC level, as shown in FIG. 7A, appears at the output end of the amplifier circuit 3. The noise component contains a noise element caused by vibrations of the disc or an optical head which emits a laser light toward the disc and guides the signal reading laser light 1 from the disc to the photo-detector 2 and another noise element caused in the amplifier circuit 3. The amplitude of this noise component is very small in comparison with the amplitude a of the reproduced information signal $S_{10}$ but is capable of being reformed into a pulse train at the wave shaping circuit 4. The DC level of the spurious signal $S_{10}'$ is shifted to zero, as shown in FIG. 7B, at the DC stopping circuit 11, and thereafter the spurious signal $S_{10}'$ with the DC level shifted to zero is supplied to the clamp circuit 12. At the clamp circuit 12, the bottom of the spurious signal $S_{10}'$ is clamped to the level $-Vc$, as shown in FIG. 7C. The spurious signal $S_{10}'$ with its bottom clamped to the level $-Vc$ is supplied to the level detector 13 and a DC output $v_O'$ of the average level or the peak level of the spurious signal $S_{10}'$ clamped to the level $-Vc$, as shown in FIG. 7D, is obtained at the output of the level detector 13 to be supplied to one of the input terminals of the level comparator 14. In this case, since the amplitude of the spurious signal $S_{10}'$ is so small in comparison with the amplitude of the reproduced information signal $S_{10}$, the level of the DC output $v_O'$ becomes very low compared with the level of the DC output $v_O$ mentioned above. Besides, since both the signal $S_{10}$ and the spurious signal $S_{10}'$ are clamped at their bottoms to the level $-Vc$ provided in common, then their average levels or peak levels are derived therefrom as the DC outputs $v_O$ and $v_O'$, respectively. A difference between the DC outputs $V_O$ and $v_O'$ becomes large and emphatically represents the difference between the amplitudes of the signal $S_{10}$ and the spurious signal $S_{10}'$.

The reference voltage supplied to the other of the input terminals of the level comparator 14 from the terminal 16 is given a level Vb between the DC outputs $v_O$ and $v_O'$, as shown in FIGS. 6D and 7D. The level comparator 14 operates to produce an output when the DC output $v_O$ which is higher than the level Vb of the reference voltage is supplied to the one input terminal thereof and not to produce any output when the DC output $v_O'$ which is lower than the level Vb of the reference voltage is supplied to the one input terminal thereof; or to produce a positive output in the former case and produce a negative output in the latter case, so that a detected output is provided from which it can be learned that either the DC output $v_O$ is supplied or the DC output $v_O'$ is supplied, that is, whether the reproduced information signal $S_{10}$ is obtained or not. This information is obtained at the output terminal 15.

In such a manner as mentioned above, the detection of the existence of the reproduced information signal $S_{10}$ is performed, and in the case of the example shown in FIG. 5, the reproducing apparatus is made inoperative and the appropriate protection for the control mechanism in the reproducing apparatus is conducted by the detected output obtained at the output terminal 15 when the reproduced information signal $S_{10}$ is not obtained. Incidentally, in case that the circuit according to the present invention is applied to the reproducing apparatus in the optical digital audio disc system as described above, since the variations in the amplitude of the reproduced information signal $S_{10}$ are relatively small, the veriations in the DC output $v_O$ obtained at the level detecting circuit 13 are also small and therefore there is no difficulty in determining appropriately the level Vb of the reference voltage at the level comparator 14.

As explained above, in accordance with the present invention, the information signal or the spurious signal which is obtained when the information signal is not obtained is clamped to the predetermined fixed level. Then the DC output having the level corresponding to the amplitude of the reproduced information signal or the spurious signal clamped to the predetermined fixed DC level, and the detected output, is produced by means of comparing the DC output with the reference voltage. Accordingly, the detection of existence of the information signal is surely achieved with high sensitivity and reliability. Besides, since each circuit portion of the circuit according to the present invention is not required to perform any complicated operation, the whole circuit structure can be very simplified. Further, in case the circuit according to the present invention is employed in the reproducing apparatus in the optical digital audio disc system, even if the digital audio disc is not rotated at the proper rotating speed, the situation wherein the reproduced information signal is obtained from the disc can be detected.

Although various minor changes and modifications might be suggested by those skilled in the art, it will be understood that I wish to include within the claims of the patent warranted hereon all such changes and modifications as reasonably come within my contribution to the art.

I claim as my invention:

1. A digital disc reproducing system for reproducing pulse code modulation (PCM) signals optically read from a disc, comprising:

photo detector means for reading a PCM information signal from the disc and creating a reproduced information signal having a waveform similar to a sine curve;

wave shaping circuit means including a differential amplifier having one input connected to receive the PCM information signal and a reference voltage generator connected at another input for creating a reproduced PCM signal having pulses whose time length corresponds to a time length between crossing points of the reproduced information signal waveform across a reference voltage, said wave shaping circuit means also responding in undesirable fashion to a noise output from said photo detector means when it is not reading a PCM information signal from a disc so as to cause an undesired pulse output;

DC stop circuit means for shifting a DC level of the reproduced information signal from the photo detecting means to zero, and a clamp circuit means connected to an output of the DC stop circuit means for clamping peaks at one side of a waveform of the reproduced information signal to a predetermined fixed DC level;

level detecting means for detecting an amplitude level of peaks at the other side of the waveform at the output of said clamp circuit means and producing a DC output having a level corresponding to the detected amplitude level;

means for comparing said DC output from said level detecting means with a predetermined reference voltage to produce an output signal having a first level when said DC output is higher than said reference voltage and a second level when said DC output is lower than said reference voltage; and said comparing means output signal being connected to control a reproducing apparatus such that when said undesired pulse output occurs from said wave shaping circuit means, the reproducing apparatus is controlled so that an undesirable noise is not reproduced.

2. A system according to claim 1 wherein the clamp circuit means clamps a bottom of the signal output from the DC stop means to a predetermined DC level.

* * * * *